(12) United States Patent
Phan et al.

(10) Patent No.: US 10,043,435 B2
(45) Date of Patent: Aug. 7, 2018

(54) IMAGE DEVICE WITH IMPROVED CHROMINANCE QUALITY

(71) Applicant: VP ASSETS LIMITED, Road Town (VG)

(72) Inventors: Gia-Chuong Phan, Berlin (DE); Maggie Phan, Vancouver (CA); Anthony Phan, Vancouver (CA); Shi-Ki Dong, Shatin (HK); Hon-Wah Wong, Shatin (HK); Ka-Ho Ng, Shatin (HK)

(73) Assignee: VP ASSETS LIMITED, Road Town (VG)

( * ) Notice: Subject to any disclaimer, the term of this patent is extended or adjusted under 35 U.S.C. 154(b) by 130 days.

(21) Appl. No.: 15/150,434

(22) Filed: May 10, 2016

(65) Prior Publication Data

US 2017/0330497 A1   Nov. 16, 2017

(51) Int. Cl.
| | |
|---|---|
| *H01L 27/32* | (2006.01) |
| *G09G 3/20* | (2006.01) |
| *G02F 1/1335* | (2006.01) |
| *G09G 3/36* | (2006.01) |
| *G09G 3/3208* | (2016.01) |

(52) U.S. Cl.
CPC ..... *G09G 3/2003* (2013.01); *G02F 1/133514* (2013.01); *G09G 3/3607* (2013.01); *H01L 27/3213* (2013.01); *G09G 3/3208* (2013.01); *G09G 2300/0452* (2013.01); *G09G 2320/0242* (2013.01)

(58) Field of Classification Search
CPC ............ G02F 1/133514; G09G 3/2003; G09G 3/3208; G09G 2300/0452; G09G 2320/0242; H01L 27/3213; H01L 27/3218
See application file for complete search history.

(56) References Cited

U.S. PATENT DOCUMENTS

| | | | | |
|---|---|---|---|---|
| 2006/0103615 | A1* | 5/2006 | Shih ..................... | G09G 3/3607 345/88 |
| 2008/0316235 | A1* | 12/2008 | Okazaki ............ | G02F 1/133514 345/694 |
| 2009/0051638 | A1* | 2/2009 | Horiuchi .............. | G09G 3/2003 345/88 |
| 2012/0062824 | A1* | 3/2012 | Lee .................... | G02F 1/133514 349/109 |
| 2014/0029250 | A1* | 1/2014 | Kwon ....................... | F21V 9/10 362/231 |
| 2014/0300626 | A1* | 10/2014 | Gu ........................ | G09G 3/3607 345/600 |
| 2016/0055781 | A1* | 2/2016 | Phan ..................... | G09G 3/2003 345/690 |

(Continued)

*Primary Examiner* — Allan R Wilson
(74) *Attorney, Agent, or Firm* — ScienBiziP, P.C.

(57) ABSTRACT

An image device includes a plurality of first sub-pixels, a plurality of second sub-pixels, a plurality of third sub-pixels, a plurality of fourth sub-pixels, and a plurality of fifth sub-pixels. The image device further comprises a plurality of basic repeating units. Each of the basic repeating units comprises the first sub-pixels, the second sub-pixels, the third sub-pixels, the fourth sub-pixels, and the fifth sub-pixel. A ratio of the first sub-pixels to the second sub-pixels to the third sub-pixels to the fourth sub-pixels and to the fifth sub-pixel in the basic repeating unit is 3:3:4:1:1.

20 Claims, 23 Drawing Sheets

(56) References Cited

U.S. PATENT DOCUMENTS

2016/0055782 A1* 2/2016 Phan ................ G02F 1/133514
                                                                                             257/89
2016/0055821 A1* 2/2016 Phan ................ G02F 1/133514
                                                                                             345/592

* cited by examiner

| R | G | B | Y | W | B | R | G | B | Y | W | B | R | G | B | Y |
|---|---|---|---|---|---|---|---|---|---|---|---|---|---|---|---|
| B | G | R | B | G | R | B | G | R | B | G | R | B | G | R | B |
| R | G | B | Y | W | B | R | G | B | Y | W | B | R | G | B | Y |
| B | G | R | B | G | R | B | G | R | B | G | R | B | G | R | B |
| R | G | B | Y | W | B | R | G | B | Y | W | B | R | G | B | Y |
| B | G | R | B | G | R | B | G | R | B | G | R | B | G | R | B |
| R | G | B | Y | W | B | R | G | B | Y | W | B | R | G | B | Y |
| B | G | R | B | G | R | B | G | R | B | G | R | B | G | R | B |

| R | G | B | W | Y | B | R | G | B | W | Y | B | R | G | B | W |
|---|---|---|---|---|---|---|---|---|---|---|---|---|---|---|---|
| R | G | B | R | G | B | R | G | B | R | G | B | R | G | B | R |
| W | Y | B | R | G | B | W | Y | B | R | G | B | W | Y | B | R |
| R | G | B | R | G | B | R | G | B | R | G | B | R | G | B | R |
| R | G | B | W | Y | B | R | G | B | W | Y | B | R | G | B | W |
| R | G | B | R | G | B | R | G | B | R | G | B | R | G | B | R |
| W | Y | B | R | G | B | W | Y | B | R | G | B | W | Y | B | R |
| R | G | B | R | G | B | R | G | B | R | G | B | R | G | B | R |

| G | R | B | W | Y | B | G | R | B | W | Y | B | G | R | B | W |
|---|---|---|---|---|---|---|---|---|---|---|---|---|---|---|---|
| G | R | B | G | R | B | G | R | B | G | R | B | G | R | B | G |
| W | Y | B | G | R | B | W | Y | B | G | R | B | W | Y | B | G |
| G | R | B | G | R | B | G | R | B | G | R | B | G | R | B | G |
| G | R | B | W | Y | B | G | R | B | W | Y | B | G | R | B | W |
| G | R | B | G | R | B | G | R | B | G | R | B | G | R | B | G |
| W | Y | B | G | R | B | W | Y | B | G | R | B | W | Y | B | G |
| G | R | B | G | R | B | G | R | B | G | R | B | G | R | B | G |

40H

| R | G | B | Y | W | B | R | G | B | Y | W | B | R | G | Y |
|---|---|---|---|---|---|---|---|---|---|---|---|---|---|---|
| R | G | B | R | G | B | R | G | B | R | G | B | R | G | B |
| Y | W | B | R | G | B | Y | W | B | R | G | B | Y | W | B |
| R | G | B | R | G | B | R | G | B | R | G | B | R | G | B |
| R | G | B | Y | W | B | R | G | B | Y | W | B | R | G | Y |
| R | G | B | R | G | B | R | G | B | R | G | B | R | G | B |
| Y | W | B | R | G | B | Y | W | B | R | G | B | Y | W | B |
| R | G | B | R | G | B | R | G | B | R | G | B | R | G | B |

| G | R | B | Y | W | B | G | R | B | Y | W | B | G | R | B | Y |
|---|---|---|---|---|---|---|---|---|---|---|---|---|---|---|---|
| G | R | B | G | R | B | G | R | B | G | R | B | G | R | B | G |
| Y | W | B | G | R | B | Y | W | B | G | R | B | Y | W | B | G |
| G | R | B | G | R | B | G | R | B | G | R | B | G | R | B | G |
| G | R | B | Y | W | B | G | R | B | Y | W | B | G | R | B | Y |
| G | R | B | G | R | B | G | R | B | G | R | B | G | R | B | G |
| Y | W | B | G | R | B | Y | W | B | G | R | B | Y | W | B | G |
| G | R | B | G | R | B | G | R | B | G | R | B | G | R | B | G |

| R | B | G | Y | B | W | R | B | G | Y | B | W | R | B | G | Y |
|---|---|---|---|---|---|---|---|---|---|---|---|---|---|---|---|
| R | B | G | R | B | G | R | B | G | R | B | G | R | B | G | R |
| R | B | G | Y | B | W | R | B | G | Y | B | W | B | B | G | Y |
| R | B | G | R | B | G | R | B | G | R | B | G | R | B | G | R |
| R | B | G | Y | B | W | R | B | G | Y | B | W | R | B | G | Y |
| R | B | G | R | B | G | R | B | G | R | B | G | R | B | G | R |
| R | B | G | Y | B | W | R | B | G | Y | B | W | B | B | G | Y |
| R | B | G | R | B | G | R | B | G | R | B | G | R | B | G | R |

| R | B | G | W | B | Y | R | B | G | W | B | Y | R | B | G | W |
|---|---|---|---|---|---|---|---|---|---|---|---|---|---|---|---|
| R | B | G | R | B | G | R | B | G | R | B | G | R | B | G | R |
| R | B | G | W | B | Y | R | B | G | W | B | Y | B | B | G | W |
| R | B | G | R | B | G | R | B | G | R | B | G | R | B | G | R |
| R | B | G | W | B | Y | R | B | G | W | B | Y | R | B | G | W |
| R | B | G | R | B | G | R | B | G | R | B | G | R | B | G | R |
| R | B | G | W | B | Y | R | B | G | W | B | Y | B | B | G | W |
| R | B | G | R | B | G | R | B | G | R | B | G | R | B | G | R |

40L

|   |   |   |   |   |   |   |   |   |   |   |   |   |   |
|---|---|---|---|---|---|---|---|---|---|---|---|---|---|
| R | G | B | Y | W | B | R | G | B | R | G | B | R | G | B | Y |
| R | G | B | R | G | B | R | G | B | Y | W | B | R | G | B | R |
| R | G | B | Y | W | B | R | G | B | R | G | B | R | G | B | Y |
| R | G | B | R | G | B | R | G | B | Y | W | B | R | G | B | R |
| R | G | B | Y | W | B | R | G | B | R | G | B | R | G | B | Y |
| R | G | B | R | G | B | R | G | B | Y | W | B | R | G | B | R |
| R | G | B | Y | W | B | R | G | B | R | G | B | R | G | B | Y |
| R | G | B | R | G | B | R | G | B | Y | W | B | R | G | B | R |

| G | R | B | Y | W | B | G | R | B | G | R | B | G | R | B | Y |
| G | R | B | G | R | B | G | R | B | Y | W | B | G | R | B | G |
| G | R | B | Y | W | B | G | R | B | G | R | B | G | R | B | Y |
| G | R | B | G | R | B | G | R | B | Y | W | B | G | R | B | G |
| G | R | B | Y | W | B | G | R | B | G | R | B | G | R | B | Y |
| G | R | B | G | R | B | G | R | B | Y | W | B | G | R | B | G |
| G | R | B | Y | W | B | G | R | B | G | R | B | G | R | B | Y |
| G | R | B | G | R | B | G | R | B | Y | W | B | G | R | B | G |

| R | G | B | Y | G | B | R | G | B | Y | G | B | R | G | B | Y |
|---|---|---|---|---|---|---|---|---|---|---|---|---|---|---|---|
| R | G | B | R | W | B | R | G | B | R | W | B | R | G | B | R |
| R | G | B | Y | G | B | R | G | B | Y | G | B | R | G | B | Y |
| R | G | B | R | W | B | R | G | B | R | W | B | R | G | B | R |
| R | G | B | Y | G | B | R | G | B | Y | G | B | R | G | B | Y |
| R | G | B | R | W | B | R | G | B | R | W | B | R | G | B | R |
| R | G | B | Y | G | B | R | G | B | Y | G | B | R | G | B | Y |
| R | G | B | R | W | B | R | G | B | R | W | B | R | G | B | R |

| B | W | R | G | B | R | G | B | Y | B | G | R | B | W | R | G |
|---|---|---|---|---|---|---|---|---|---|---|---|---|---|---|---|
| B | R | G | B | Y | B | R | G | B | R | W | G | B | R | G | B |
| B | W | R | G | B | R | G | B | Y | B | G | R | B | W | R | G |
| B | R | G | B | Y | B | R | G | B | R | W | G | B | R | G | B |
| B | W | R | G | B | R | G | B | Y | B | G | R | B | W | R | G |
| B | R | G | B | Y | B | R | G | B | R | W | G | B | R | G | B |
| B | W | R | G | B | R | G | B | Y | B | G | R | B | W | R | G |
| B | R | G | B | Y | B | R | G | B | R | W | G | B | R | G | B |

| R | G | B | W | G | B | R | Y | B | R | G | B | R | G | B | W |
|---|---|---|---|---|---|---|---|---|---|---|---|---|---|---|---|
| B | R | G | B | R | Y | B | G | R | B | W | G | B | R | G | B |
| R | G | B | W | G | B | R | Y | B | R | G | B | R | G | B | W |
| B | R | G | B | R | Y | B | G | R | B | W | G | B | R | G | B |
| R | G | B | W | G | B | R | Y | B | R | G | B | R | G | B | W |
| B | R | G | B | R | Y | B | G | R | B | W | G | B | R | G | B |
| R | G | B | W | G | B | R | Y | B | R | G | B | R | G | B | W |
| B | R | G | B | R | Y | B | G | R | B | W | G | B | R | G | B |

| | | | | | | | | | | | | | |
|---|---|---|---|---|---|---|---|---|---|---|---|---|---|
| B | W | R | G | B | R | G | B | Y | B | G | R | B | W | R | G |
| R | G | B | W | Y | B | R | G | B | R | G | B | R | G | B | W |
| B | W | R | G | B | R | G | B | Y | B | G | R | B | W | R | G |
| R | G | B | W | Y | B | R | G | B | R | G | B | R | G | B | W |
| B | W | R | G | B | R | G | B | Y | B | G | R | B | W | R | G |
| R | G | B | W | Y | B | R | G | B | R | G | B | R | G | B | W |
| B | W | R | G | B | R | G | B | Y | B | G | R | B | W | R | G |
| R | G | B | W | Y | B | R | G | B | R | G | B | R | G | B | W |

|   |   |   |   |   |   |   |   |   |   |   |   |   |   |
|---|---|---|---|---|---|---|---|---|---|---|---|---|---|
| B | R | G | B | R | G | B | Y | R | B | G | W | B | R | G | B |
| R | G | B | Y | B | W | R | G | B | R | G | B | R | G | B | Y |
| B | R | G | B | R | G | B | Y | R | B | G | W | B | R | G | B |
| R | G | B | Y | B | W | R | G | B | R | G | B | R | G | B | Y |
| B | R | G | B | R | G | B | Y | R | B | G | W | B | R | G | B |
| R | G | B | Y | B | W | R | G | B | R | G | B | R | G | B | Y |
| B | R | G | B | R | G | B | Y | R | B | G | W | B | R | G | B |
| R | G | B | Y | B | W | R | G | B | R | G | B | R | G | B | Y |

| B | R | G | B | R | G | B | Y | R | B | G | W | B | R | G | B |
|---|---|---|---|---|---|---|---|---|---|---|---|---|---|---|---|
| R | Y | B | R | W | B | G | R | B | G | R | R | R | Y | B | R |
| B | R | G | B | R | G | B | Y | R | B | G | W | B | R | G | B |
| R | Y | B | R | W | B | G | R | B | G | R | R | R | Y | B | R |
| B | R | G | B | R | G | B | Y | R | B | G | W | B | R | G | B |
| R | Y | B | R | W | B | G | R | B | G | R | R | R | Y | B | R |
| B | R | G | B | R | G | B | Y | R | B | G | W | B | R | G | B |
| R | Y | B | R | W | B | G | R | B | G | R | R | R | Y | B | R |

| R | G | B | Y | G | B | R | G | B | R | W | B | R | G | B | Y |
|---|---|---|---|---|---|---|---|---|---|---|---|---|---|---|---|
| R | G | B | R | W | B | R | G | B | Y | G | B | R | G | B | R |
| R | G | B | Y | G | B | R | G | B | R | W | B | R | G | B | Y |
| R | G | B | R | W | B | R | G | B | Y | G | B | R | G | B | R |
| R | G | B | Y | G | B | R | G | B | R | W | B | R | G | B | Y |
| R | G | B | R | W | B | R | G | B | Y | G | B | R | G | B | R |
| R | G | B | Y | G | B | R | G | B | R | W | B | R | G | B | Y |
| R | G | B | R | W | B | R | G | B | Y | G | B | R | G | B | R |

| B | G | Y | B | G | R | B | G | R | B | W | R | B | G | Y | B |
|---|---|---|---|---|---|---|---|---|---|---|---|---|---|---|---|
| B | G | R | B | W | R | B | G | Y | B | G | R | B | G | R | B |
| B | G | Y | B | G | R | B | G | R | B | W | R | B | G | Y | B |
| B | G | R | B | W | R | B | G | Y | B | G | R | B | G | R | B |
| B | G | Y | B | G | R | B | G | R | B | W | R | B | G | Y | B |
| B | G | R | B | W | R | B | G | Y | B | G | R | B | G | R | B |
| B | G | Y | B | G | R | B | G | R | B | W | R | B | G | Y | B |
| B | G | R | B | W | R | B | G | Y | B | G | R | B | G | R | B |

| G | B | R | Y | B | R | G | B | R | G | B | W | G | B | R | Y |
|---|---|---|---|---|---|---|---|---|---|---|---|---|---|---|---|
| B | R | G | B | R | G | B | W | G | R | R | Y | B | R | G | B |
| G | B | R | Y | B | R | G | B | R | G | B | W | G | B | R | Y |
| B | R | G | B | R | G | B | W | G | R | R | Y | B | R | G | B |
| G | B | R | Y | B | R | G | B | R | G | B | W | G | B | R | Y |
| B | R | G | B | R | G | B | W | G | R | R | Y | B | R | G | B |
| G | B | R | Y | B | R | G | B | R | G | B | W | G | B | R | Y |
| B | R | G | B | R | G | B | W | G | R | R | Y | B | R | G | B |

FIG. 32

IMAGE DEVICE WITH IMPROVED CHROMINANCE QUALITY

FIELD

The subject matter herein generally relates to display technology, pertains particularly to image device with improved chrominance quality of an image device or a display.

TECHNICAL FIELD

Figure 1:
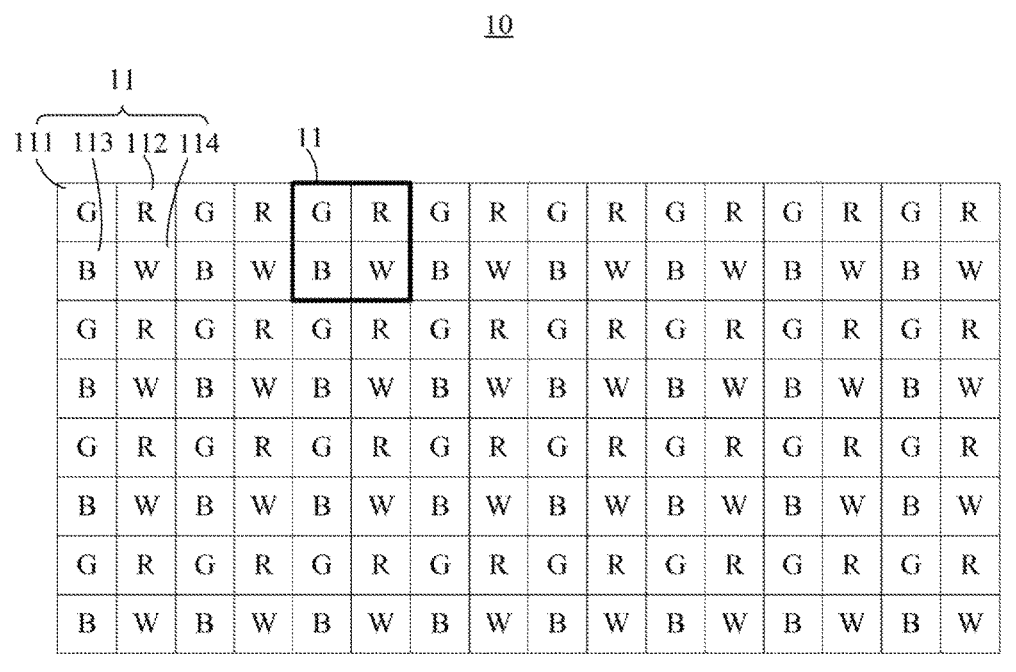

FIG. 1 shows a conventional RGBW display. The conventional RGBW display 10 includes a plurality of RGBW pixels 11. Each RGBW pixel 11 includes a green sub-pixel 111, a red sub-pixel 112, a blue sub-pixel 113 and a white sub-pixel 114 arranged in a 2×2 matrix. The conventional RGBW display 10 has the merit of enhanced color space and improved brightness and contrast, compared with traditional RGB display. U.S. Pat. No. 4,892,391, U.S. Pat. No. 5,757,452, U.S. Pat. Nos. 7,286,136, 7,742,205, and U.S. Pat. No. 7,583,279 teach RGBW displays. However, the conventional RGBW display 10 has the deficiency of dark yellow. U.S. Pat. No. 4,800,375, U.S. Pat. No. 7,864,271, and U.S. Pat. No. 8,749,727 teach RGBY displays which claim to have better yellow color. However, RGBY display lacks the merits of RGBW displays. U.S. Pat. No. 7,248,314, U.S. Pat. No. 7,995,019, U.S. Pat. No. 8,248,440, U.S. Pat. No. 8,441,601 and U.S. Pat. No. 8,558,857 teach displays with five color sub-pixels. However five color displays have the deficiency of high cost and low brightness and contrast. U.S. Pat. No. 8,384,653 teaches a method to relief the dark yellow problem by classifying the image signal and then adjusts the backlight luminance according to the classification.

BRIEF DESCRIPTION OF THE DRAWINGS

Implementations of the present technology will now be described, by way of example only, with reference to the attached figures.

FIG. 1 illustrates a conventional RGBW display.

Figures 5, 6:
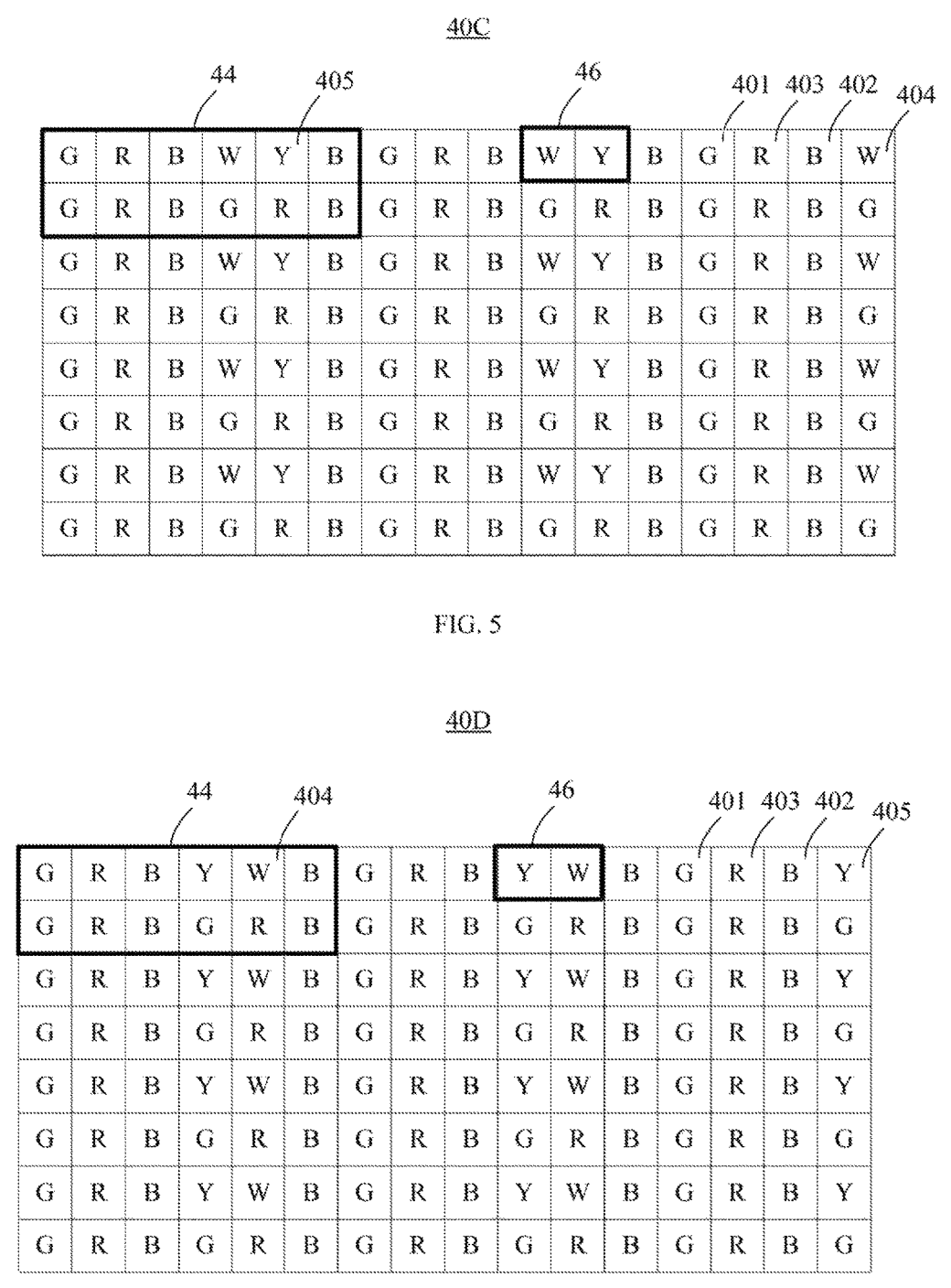

FIGS. 3-7 illustrate image devices of FIG. 2 according to the first exemplary embodiment of the present disclosure.

FIGS. 9-12 illustrate image devices of FIG. 8 according to the second exemplary embodiment of the present disclosure.

FIGS. 14-15 illustrate image devices of FIG. 13 according to the third exemplary embodiment of the present disclosure.

FIGS. 17-19 illustrate image devices of FIG. 16 according to the fourth exemplary embodiment of the present disclosure.

FIG. 21 illustrates an image device of FIG. 20 according to the fifth exemplary embodiment of the present disclosure.

FIGS. 23-25 illustrate image devices of FIG. 22 according to the sixth exemplary embodiment of the present disclosure.

FIGS. 27-30 illustrate image devices of FIG. 26 according to the seventh exemplary embodiment of the present disclosure.

FIG. 32 illustrates an image device of FIG. 30 according to the eighth exemplary embodiment of the present disclosure.

DETAILED DESCRIPTION

Figure 2:
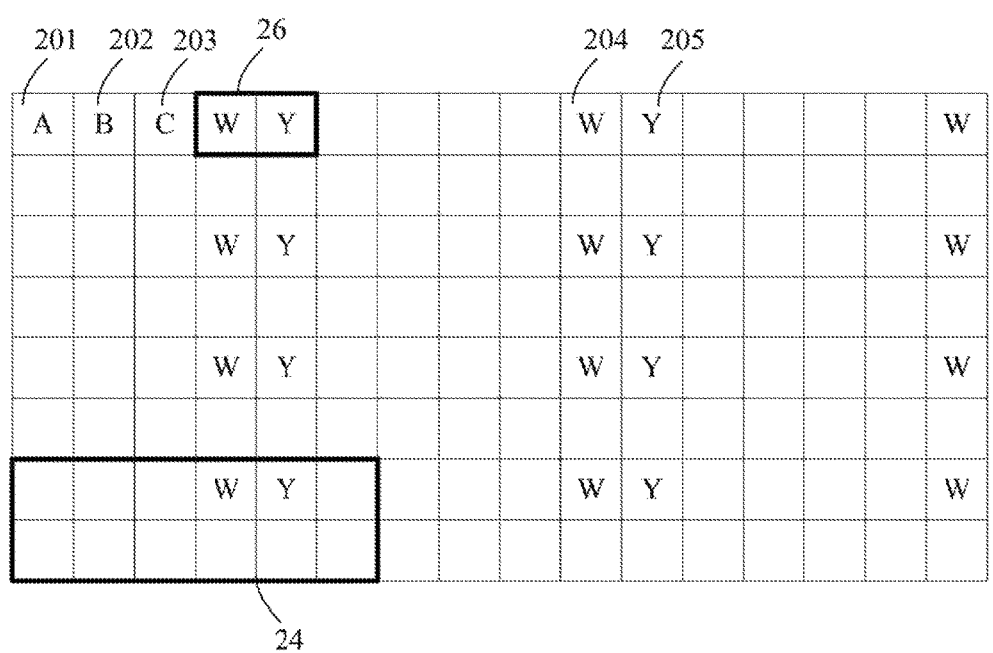
FIG. 2 illustrates an image device according to a first exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features. The description is not to be considered as limiting the scope of the exemplary embodiments described herein.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

For consistency purpose and ease of understanding, like features are identified (although, in some instances, not shown) with like numerals in the exemplary figures. However, the features in different exemplary embodiments may differ in other respects, and thus shall not be narrowly confined to what is shown in the figures.

FIG. 2 illustrates a schematic planar of an image device 20 in accordance with a first exemplary embodiment of the instant disclosure. The image device 20 includes a plurality of pixels including a plurality of sub-pixels with different colors arranged in a matrix of rows and columns. A basic repeating pixel unit 24 is defined by the sub-pixel with different colors arranged in a matrix of rows and columns. The basic repeating pixel 24 includes a first sub-pixel 201, a second sub-pixel 202, a third sub-pixel 203, a fourth sub-pixel 204, and a fifth sub-pixel 205. A ratio of the first sub-pixel 201 to the second sub-pixel 202 to the third sub-pixel 203 to the fourth sub-pixel 204 to the fifth sub-pixel 205 is 3:3:4:1:1.

Figures 3, 4:
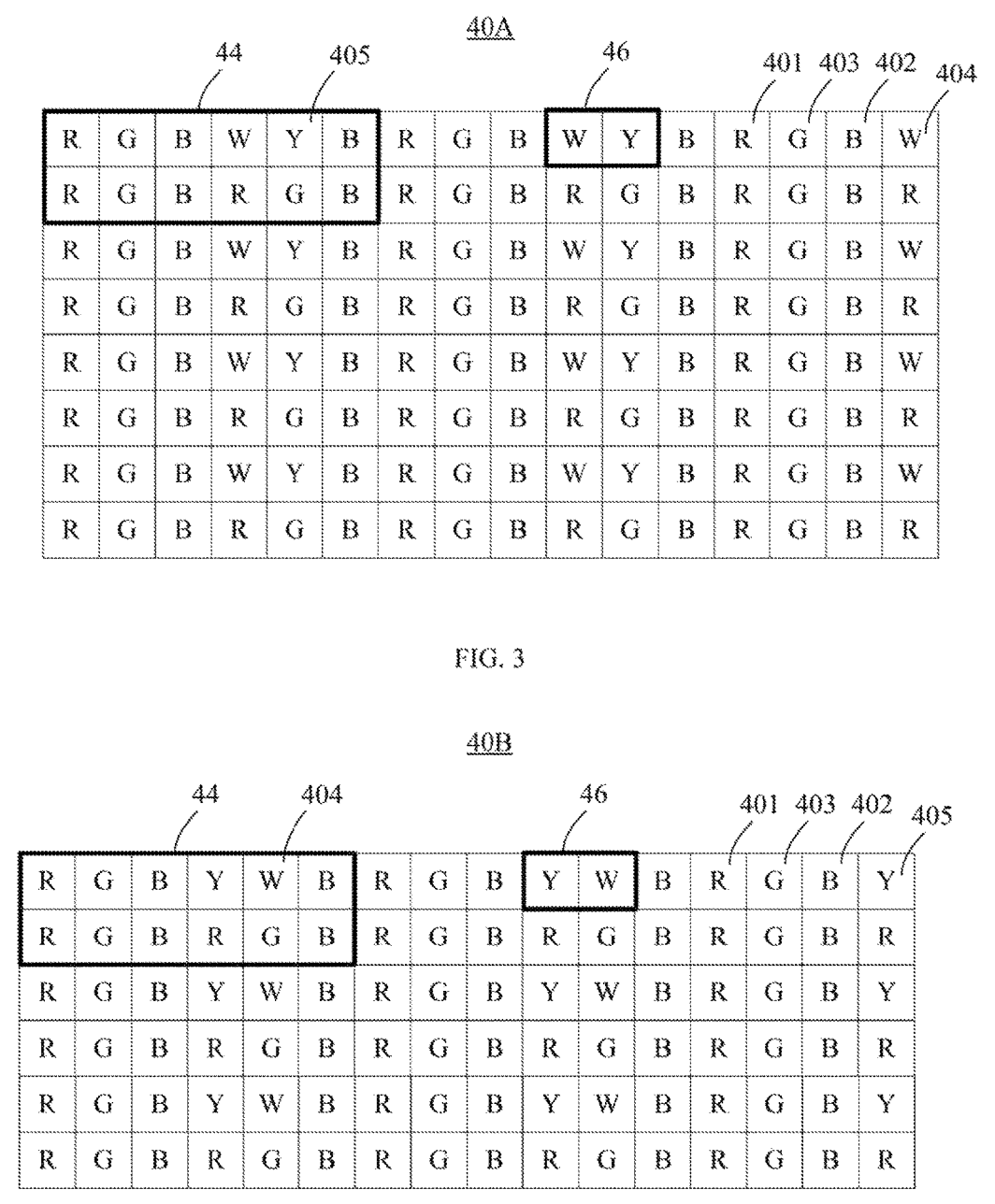

FIG. 3 illustrates a first exemplary embodiment of the image device 20. The basic repeating pixel unit 24 is a 2×6 matrix. Every odd row includes the fourth sub-pixels 204 and the fifth sub-pixels 205. Every even row excludes the fourth sub-pixels 204 and the fifth sub-pixel 205. Namely, in any two adjacent rows, one of the two adjacent rows contains the fourth sub-pixels 204 and the fifth sub-pixels 205, and the other of the two adjacent rows excludes the fourth sub-pixels 204 and the fifth sub-pixel 205. A pixel group 26 is defined by one fourth sub-pixel 204 and one fifth sub-pixels 205 in a same row, the fifth sub-pixels 205 is adjacent to the fourth sub-pixel 204 in the same pixel group. Each of the pixel groups 26 is separated from each other by four sub-pixels different from the fourth sub-pixel 204 and the fifth sub-pixels 205. Each of two adjacent columns containing the fourth sub-pixel 204 and the fifth sub-pixel 205 are separated from each other by four columns with sub-pixels different from the fourth sub-pixel 204 and the fifth sub-pixel 205. In each of the columns containing the fourth sub-pixels 204, the fourth sub-pixels 204 are arranged in different rows, and are separated from each other by one sub-pixel different from the fourth sub-pixel 204 and the fifth sub-pixel 205. In each of the columns containing the fifth sub-pixels 205, the fifth sub-pixels 205 are arranged in different rows, and are separated from each other by one sub-pixel different from the fourth sub-pixel 204 and the fifth sub-pixel 205. In at least one embodiment, the fourth sub-pixel 204 is a white sub-pixel, and the fifth sub-pixel is a yellow sub-pixel. FIG. 2 shows an arrangement rule of the fourth sub-pixels 204 and the fifth sub-pixels 205 according to the first exemplary embodiment.

FIGS. 3-7 illustrate several modified examples of image devices 40A-40E following the arrangement rule of the white sub-pixels 404 and the yellow sub-pixels 405 described above shown in FIG. 2 according to the first exemplary embodiment of the present disclosure. Each of the image devices 40A-40E includes a plurality of pixels including a plurality of sub-pixels with different colors arranged in a matrix of rows and columns. A basic repeating pixel unit 44 is defined by the sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIGS. 3-7, the basic repeating pixel unit 44 is a 2×6 matrix. Every odd row includes the white sub-pixels 404 and the yellow sub-pixels 405. Every even row excludes the white sub-pixels 404 and the yellow sub-pixel 405. Namely, in any two adjacent rows, one of the two adjacent rows contains the white sub-pixels 404 and the yellow sub-pixels 405, and the other of the two adjacent rows excludes the white sub-pixels 404 and the yellow sub-pixel 405. A pixel group 46 is defined by one white sub-pixel 404 and one yellow sub-pixel 405 in a same row, the yellow sub-pixels 405 is adjacent to the white sub-pixels 404 in the same pixel group. Each of the pixel groups 46 is separated from each other by four sub-pixels different from the white sub-pixel 404 and the yellow sub-pixels 405. Each of two adjacent columns containing the white sub-pixel 404 and the yellow sub-pixel 405 are separated from each other by four columns with sub-pixels different from the white sub-pixel 404 and the yellow sub-pixel 405. In each of the columns containing the white sub-pixels 404, the white sub-pixels 404 are arranged in different rows, and are separated from each other by one sub-pixel different from the white sub-pixel 404 and the yellow sub-pixel 405. In each of the columns containing the yellow sub-pixels 405, the yellow sub-pixels 405 are arranged in different rows, and are separated from each other by one sub-pixel different from the white sub-pixel 404 and the yellow sub-pixel 405.

In the image devices 40A-40B, and 40E, the first sub-pixel 401 is a red sub-pixel, the second sub-pixel 402 is a blue sub-pixel, and the third sub-pixel 403 is a green sub-pixel. In the image devices 40C-40D, the first sub-pixel 401 is a green sub-pixel, the second sub-pixel 402 is a blue sub-pixel, and the third sub-pixel 403 is a red sub-pixel.

Figure 8:
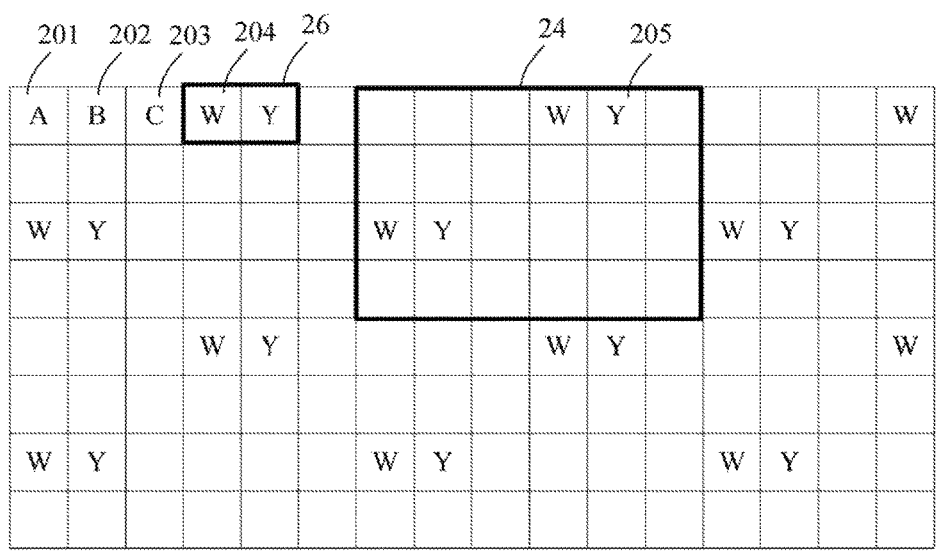
FIG. 8 illustrate an image device according to a second exemplary embodiment of the present disclosure.

FIG. 8 illustrates a second exemplary embodiment of the image device 20. The basic repeating pixel unit 24 is a 4×6 matrix. Every odd row includes the fourth sub-pixels 204 and the fifth sub-pixels 205. Every even row excludes the fourth sub-pixels 204 and the fifth sub-pixel 205. Namely, in any two adjacent rows, one of the two adjacent rows contains the fourth sub-pixels 204 and the fifth sub-pixels 205, and the other of the two adjacent rows excludes the fourth sub-pixels 204 and the fifth sub-pixel 205. A pixel group 26 is defined by one fourth sub-pixel 204 and one fifth sub-pixel 205 in a same row, the fifth sub-pixels 205 is adjacent to the fourth sub-pixel 204 in the same pixel group. Each of the pixel groups 26 is separated from each other by four sub-pixels different from the fourth sub-pixel 204 and the fifth sub-pixels 205. The fourth sub-pixels 204 are arranged in columns excluding fifth sub-pixels 205, and the fifth sub-pixels 205 are arranged in columns excluding fourth sub-pixels 204. Each column containing the fifth sub-pixels 205 is arranged adjacent to one column containing fourth sub-pixels 204. Each of two adjacent columns containing the fourth sub-pixels 204 and the fifth sub-pixels 205 are separated from each other by one column with sub-pixels different from the fourth sub-pixel 204 and the fifth sub-pixel 205. In each of the columns containing the fourth sub-pixels 204, the fourth sub-pixels 204 are arranged in different rows, and are separated from each other by three sub-pixels different from the fourth sub-pixel 204 and the fifth sub-pixel 205. In each of the columns containing the fifth sub-pixels 205, the fifth sub-pixels 205 are arranged in different rows, and are separated from each other by three sub-pixels different from the fourth sub-pixel 204 and the fifth sub-pixel 205. In at least one embodiment, the fourth sub-pixel 204 is the white sub-pixel, and the fifth sub-pixel 205 is a yellow sub-pixel. FIG. 8 shows an arrangement rule of the fourth sub-pixels 204 and the fifth the sub-pixels 205 according to the second exemplary embodiment.

FIGS. 9-12 illustrate several modified examples of image devices 40E-40I following the arrangement rule of the white sub-pixels 404 and the yellow sub-pixels 405 described above shown in FIG. 8 according to the second exemplary embodiment of the present disclosure. Each of the image devices 40E-40I includes a plurality of pixels including a plurality of sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIGS. 9-12, the basic repeating pixel unit 44 is a 4×6 matrix. Every odd row includes the white sub-pixels 404 and the yellow sub-pixels 405. Every even row excludes the white sub-pixels 504 and the yellow sub-pixel 405. Namely, in any two adjacent rows, one of the two adjacent rows contains the white sub-pixels 404 and the yellow sub-pixels 405, and the other of the two adjacent rows excludes the white sub-pixels 404 and the yellow sub-pixel 405. A pixel group 46 is defined by one white sub-pixel 404 and one yellow sub-pixel 405 in a same row, the yellow sub-pixel 405 is adjacent to the white sub-pixels 404 in the same pixel group. Each of the pixel groups 46 is separated from each other by four sub-pixels different from the white sub-pixel 404 and the yellow sub-pixel 405. The white sub-pixels 404 are arranged in columns excluding yellow sub-pixels 405, and the yellow sub-pixels 405 are arranged in columns excluding white sub-pixels 404. Each column containing the yellow sub-pixels 405 is arranged adjacent to one column containing white sub-pixels 404. Each of two adjacent columns containing the white sub-pixels 404 and the yellow sub-pixels 405 are separated from each other by one column with sub-pixels different from the white sub-pixel 404 and the yellow sub-pixel 405. In each of the columns containing the white sub-pixels 404, the white sub-pixels 404 are arranged in different rows, and are separated from each other by three sub-pixels different from the white sub-pixel 404 and the yellow sub-pixel 405. In each of the columns containing the yellow sub-pixels 405, the yellow sub-pixels 405 are arranged in different rows, and are separated from each other by three sub-pixels different from the white sub-pixel 404 and the yellow sub-pixel 405.

In the image devices 40F and 40H, the first sub-pixel 401 is a red sub-pixel, the second sub-pixel 402 is a blue sub-pixel, and the third sub-pixel 403 is a green sub-pixel. In the image devices 40G and 40I, the first sub-pixel 401 is a green sub-pixel, the second sub-pixel 402 is a blue sub-pixel, and the third sub-pixel 403 is a red sub-pixel.

Figure 13:
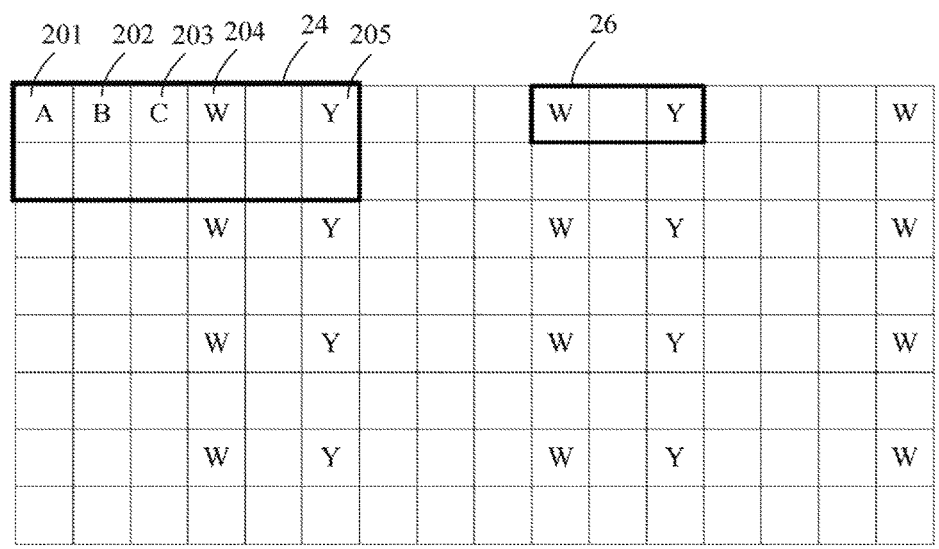
FIG. 13 illustrates an image device according to a third exemplary embodiment of the present disclosure.

FIG. 13 illustrates a third exemplary embodiment of the image device 20. The basic repeating pixel unit 24 is a 2×6 matrix. Every odd row includes the fourth sub-pixels 204 and the fifth sub-pixels 205. Every even row excludes the fourth sub-pixels 204 and the fifth sub-pixel 205. Namely, in any two adjacent rows, one of the two adjacent rows contains the fourth sub-pixels 204 and the fifth sub-pixels 205, and the other of the two adjacent rows excludes the fourth sub-pixels 204 and the fifth sub-pixel 205. A pixel group 26 is defined by one fourth sub-pixel 204 and one fifth sub-pixel 205 in a same row. The fifth sub-pixel 205 is separated from the fourth sub-pixel 204 in the same pixel group by one sub-pixel different from the fourth sub-pixel 204 and the fifth sub-pixel 205. The fourth sub-pixels 204 and the fifth sub-pixels 205 are arranged in different columns, respectively. Each of the pixel groups 26 is separated from each other by three sub-pixels different from the fourth sub-pixel 204 and the fifth sub-pixel 205. The columns containing the fourth sub-pixels 204 are separated from the columns containing the fifth sub-pixels 205. In each of the column containing the fourth sub-pixels 204, the fourth sub-pixel 204 are arranged in different rows, and are separated from each other by one column with sub-pixels different from the fourth sub-pixel 204 and the fifth sub-pixel 205. In each of the columns containing the fifth sub-pixels 205, the fifth sub-pixels 205 are arranged in different rows, and are separated from each other by three sub-pixels different from the fourth sub-pixel 204 and the fifth sub-pixel 205. In at least one embodiment, the fourth sub-pixel 204 is a white sub-pixel, and the fifth sub-pixels 205 is a yellow sub-pixel. FIG. 13 shows an arrangement rule of the fourth sub-pixels 204 and the fifth the sub-pixels 205 according to the third exemplary embodiment.

FIGS. 14-15 illustrate two modified examples of image devices 40J-40K following the arrangement rule of the fourth sub-pixels 404 and fifth sub-pixels 405 described above shown in FIG. 13 according to the third exemplary embodiment of the present disclosure. Each of the image devices 40J-40K includes a plurality of pixels including a plurality of sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIGS. 14-15, the basic repeating pixel unit 44 is a 2×6 matrix. Every odd row includes the white sub-pixels 404 and the yellow sub-pixels 405. Every odd row includes the white sub-pixels 404 and the yellow sub-pixels 405. Every even row excludes the white sub-pixels 404 and the yellow sub-pixel 405. Namely, in any two adjacent rows, one of the two adjacent rows contains the white sub-pixels 404 and the yellow sub-pixels 405, and the other of the two adjacent rows excludes the white sub-pixels 404 and the yellow sub-pixel 405. A pixel group 46 is defined by one white sub-pixel 404 and one yellow sub-pixel 405 in a same row. The yellow sub-pixel 405 is separated from the white sub-pixel 404 in the same pixel group by one sub-pixel different from the white sub-pixel 404 and the yellow sub-pixel 405. Each of the pixel groups 46 is separated from each other by three sub-pixels different from the white sub-pixel 404 and the yellow sub-pixels 405. The columns containing the white sub-pixels 404 are separated from the columns containing the yellow sub-pixels 405. In each of the column containing the white sub-pixels 404, the white sub-pixels 404 are arranged in different rows, and are separated from each other by one column with sub-pixels different from the white sub-pixel 404 and the yellow sub-pixel 405. In each of the columns containing the yellow sub-pixels 405, the yellow sub-pixels 405 are arranged in different rows, and are separated from each other by three sub-pixels different from the white sub-pixel 404 and the yellow sub-pixel 405.

In the image devices 40J-04K, the first sub-pixel 401 is a red sub-pixel, the second sub-pixel 402 is a green sub-pixel, and the third sub-pixel 403 is a blue sub-pixel.

Figure 16:
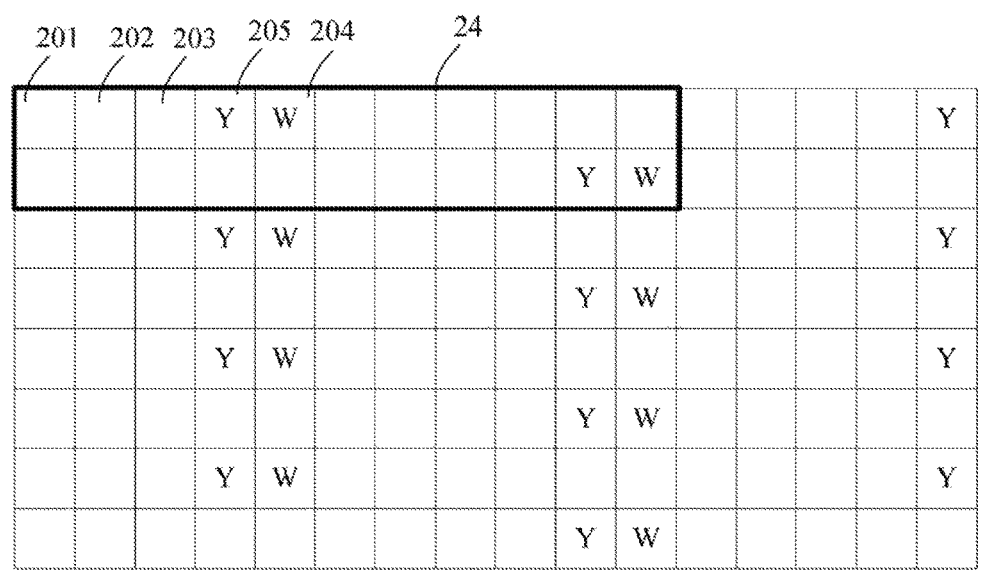
FIG. 16 illustrates an image device according to a fourth exemplary embodiment of the present disclosure.

FIG. 16 illustrates a fourth exemplary embodiment of the image device 20. The basic repeating pixel unit 24 is a 2×12 matrix. Each of the rows contains the fourth sub-pixels 204 and the fifth sub-pixels 205. A pixel group 26 is defined by one the fourth sub-pixels 204 and one fifth sub-pixels 205 in a same row. In the same row, the pixel groups 26 are separated from each other by ten sub-pixels different from the fourth sub-pixel 204 and the fifth sub-pixels 205. In any two adjacent rows, the pixel groups 26 are staggered disposed. Each of two adjacent columns containing the fourth sub-pixel 204 and the fifth sub-pixel 205 are separated from each other by four columns with sub-pixels different from the fourth sub-pixel 204 and the fifth sub-pixel 205. In each of the columns containing the fourth sub-pixels 204, the fourth sub-pixels 204 are arranged in different rows, and are separated from each other by one sub-pixel different from the fourth sub-pixel 204 and the fifth sub-pixel 205. In each of the columns containing the fifth sub-pixels 205, the fifth sub-pixels 205 are arranged in different rows, and are separated from each other by one sub-pixel different from the fourth sub-pixel 204 and the fifth sub-pixel 205. In at least one embodiment, the fourth sub-pixel 204 is the white sub-pixel, and the fifth sub-pixels 205 is a yellow sub-pixel. FIG. 16 shows an arrangement rule of the fourth sub-pixels 204 and the fifth the sub-pixels 205 according to the fourth exemplary embodiment.

Figure 19:
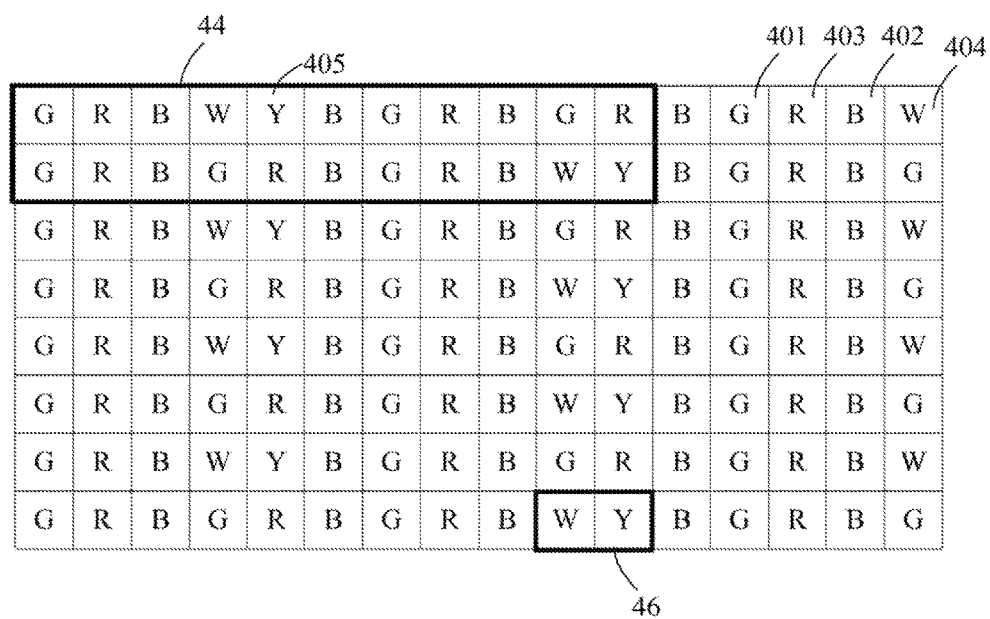

FIGS. 17-19 illustrate several modified examples of image devices 40L-40N following the arrangement rule of the fourth sub-pixels 404 and fifth sub-pixels 405 described above shown in FIG. 16 according to the fourth exemplary embodiment of the present disclosure. Each of the image devices 40L-40N includes a plurality of pixels including a plurality of sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the fourth sub-pixels 404 to the fifth sub-pixels 405 is 3:3:4:1:1.

As shown in FIGS. 17-19, the basic repeating pixel unit 44 is a 2×12 matrix. Each of the rows contains the white sub-pixels 404 and the yellow sub-pixels 405. A pixel group 46 is defined by one white sub-pixel 404 and one yellow sub-pixel 405 in a same row. In the same row, the pixel groups 46 are separated from each other by ten sub-pixels different from the white sub-pixel 404 and the yellow sub-pixel 405. In any two adjacent rows, the pixel groups 46 are staggered disposed. Each of two adjacent columns containing the white sub-pixels 404 and the yellow sub-pixels 405 are separated from each other by four columns with sub-pixels different from the white sub-pixel 404 and the yellow sub-pixel 405. In each of the columns containing the white sub-pixels 404, the white sub-pixels 404 are arranged in different rows, and are separated from each other by one sub-pixel different from the white sub-pixel 404 and the yellow sub-pixel 405. In each of the columns containing the yellow sub-pixels 405, the yellow sub-pixels 405 are arranged in different rows, and are separated from each other by one sub-pixel different from the white sub-pixel 404 and the yellow sub-pixel 405.

In the image device 40L, the first sub-pixel 401 is a red sub-pixel, the second sub-pixel 402 is a blue sub-pixel, and the third sub-pixel 403 is a green sub-pixel. In the image devices 40M-40N, the first sub-pixel 401 is a green sub-pixel, the second sub-pixel 402 is a blue sub-pixel, and the third sub-pixel 403 is a red sub-pixel.

Figure 20:
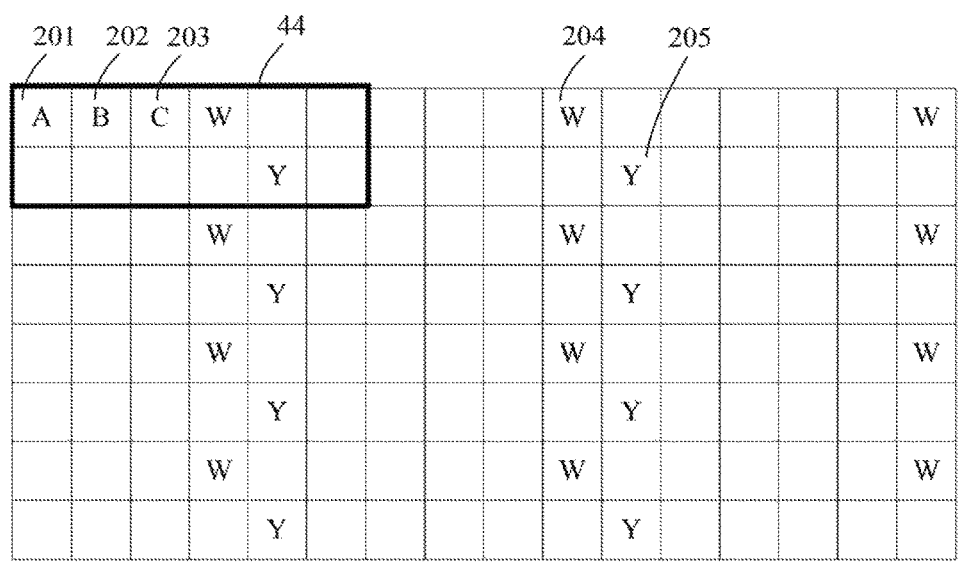
FIG. 20 illustrates an image device according to a fifth exemplary embodiment of the present disclosure.

FIG. 20 illustrates a fifth exemplary embodiment of the image device 20. The basic repeating pixel unit 24 is a 2×6 matrix. Every odd row includes the fourth sub-pixels 204 and excludes the fifth sub-pixels 205. Every even row includes the fifth sub-pixels 205 and excludes the fourth sub-pixels 204. Namely, in any two adjacent rows, one of the two adjacent rows contains the fourth sub-pixels 204 and excludes the fifth sub-pixels 205, and the other of the two adjacent rows includes the fifth sub-pixels 205 and excludes the fourth sub-pixels 204. In a same row, the fourth sub-pixels 204 are separated from each other by five sub-pixels different from the fourth sub-pixel 204 and the fifth sub-pixel 205. In a same row, the fifth sub-pixels 204 are separated from each other by five sub-pixels different from the fourth sub-pixel 204 and the fifth sub-pixel 205. The fourth sub-pixels 204 are arranged in columns excluding fifth sub-pixels 205, and the fifth sub-pixels 205 are arranged in columns excluding fourth sub-pixels 204. Each column containing the fifth sub-pixels 205 is arranged adjacent to one column containing fourth sub-pixels 204. Each of two adjacent columns containing the fourth sub-pixels 204 and the fifth sub-pixels 205 are separated from each other by four columns with sub-pixels different from the fourth sub-pixel 204 and the fifth sub-pixel 205. In each of the columns containing the fourth sub-pixels 204, the fourth sub-pixels 204 are arranged in different rows, and are separated from each other by one sub-pixel different from the fourth sub-pixel 204 and the fifth sub-pixel 205. In each of the columns containing the fifth sub-pixels 205, the fifth sub-pixels 205 are arranged in different rows, and are separated from each other by one sub-pixel different from the fourth sub-pixel 204 and the fifth sub-pixel 205. In at least one embodiment, the fourth sub-pixel 204 is the white sub-pixel, and the fifth sub-pixels 205 is a yellow sub-pixel. FIG. 20 shows an arrangement rule of the fourth sub-pixels 204 and the fifth the sub-pixels 205 according to the fifth exemplary embodiment.

FIG. 21 illustrates a modified examples of image devices 40P following the arrangement rule of the fourth sub-pixels 404 and fifth sub-pixels 405 described above shown in FIG. 20 according to the fifth exemplary embodiment of the present disclosure. Each of the image devices 40P includes a plurality of pixels including a plurality of sub-pixels with different colors arranged in a matrix of rows and columns. A basic repeating pixel unit 44 is defined by the sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIG. 21, the basic repeating pixel unit 44 is a 2×12 matrix. Every odd row includes the white sub-pixels 404 and excludes the yellow sub-pixels 405. Every even row includes the yellow sub-pixels 405 and excludes the white sub-pixels 404. Namely, in any two adjacent rows, one of the two adjacent rows contains the white sub-pixels 404 and excludes the yellow sub-pixels 405, and the other of the two adjacent rows includes the yellow sub-pixels 405 and excludes the white sub-pixels 404. In a same row, the white sub-pixels 404 are separated from each other by five sub-pixels different from the white sub-pixel 404 and the yellow sub-pixel 405. In a same row, the yellow sub-pixels 404 are separated from each other by five sub-pixels different from the white sub-pixel 404 and the yellow sub-pixel 405. The white sub-pixels 404 are arranged in columns excluding yellow sub-pixels 405, and the yellow sub-pixels 405 are arranged in columns excluding white sub-pixels 404. Each column containing the yellow sub-pixels 405 is arranged adjacent to one column containing white sub-pixels 404. Each of two adjacent columns containing the white sub-pixels 404 and the yellow sub-pixels 405 are separated from each other by four columns with sub-pixels different from the white sub-pixel 404 and the yellow sub-pixel 405. In each of the columns containing the white sub-pixels 404, the white sub-pixels 404 are arranged in different rows, and are separated from each other by one sub-pixel different from the white sub-pixel 404 and the yellow sub-pixel 405. In each of the columns containing the yellow sub-pixels 405, the yellow sub-pixels 405 are arranged in different rows, and are separated from each other by one sub-pixel different from the white sub-pixel 404 and the yellow sub-pixel 405.

Figure 22:
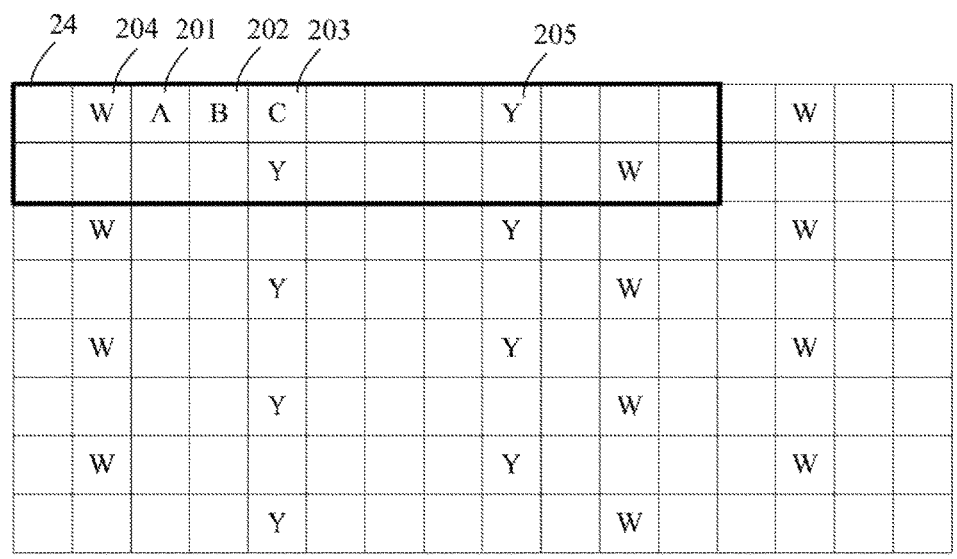
FIG. 22 illustrates an image device according to a sixth exemplary embodiment of the present disclosure.

In the image device 40P, the first sub-pixel 201 is the red sub-pixel, the second sub-pixel 202 is blue sub-pixel, and the third sub-pixel 203 is the green sub-pixel FIG. 22 illustrates a sixth exemplary embodiment of the image device 20. The basic repeating pixel unit 24 is a 2×12 matrix. Each row includes the fourth sub-pixels 204 and the fifth sub-pixels 205. In a same row, the fourth sub-pixels 204 and the fifth sub-pixels 205 are separated disposed, and each the fifth sub-pixels 205 is arranged between the two fourth sub-pixels 204. Each two adjacent columns containing the fifth sub-pixels 205 are arranged between two columns containing the fourth sub-pixels 204. In each of the columns containing the fourth sub-pixels 204, the fourth sub-pixels 204 are arranged in different rows, and are separated from each other by one sub-pixel different from the fourth sub-pixel 204 and the fifth sub-pixel 205. In each of the columns containing the fifth sub-pixels 205, the fifth sub-pixels 205 are arranged in different rows, and are separated from each other by one sub-pixel different from the fourth sub-pixel 204 and the fifth sub-pixel 205. In at least one exemplary embodiment, each of the fourth sub-pixels 204 is a white sub-pixel, and each of the fifth sub-pixels 205 is a yellow sub-pixel. FIG. 22 shows an arrangement rule of the fourth sub-pixels 204 the fifth sub-pixels 205 according to the sixth exemplary embodiment.

Figure 25:
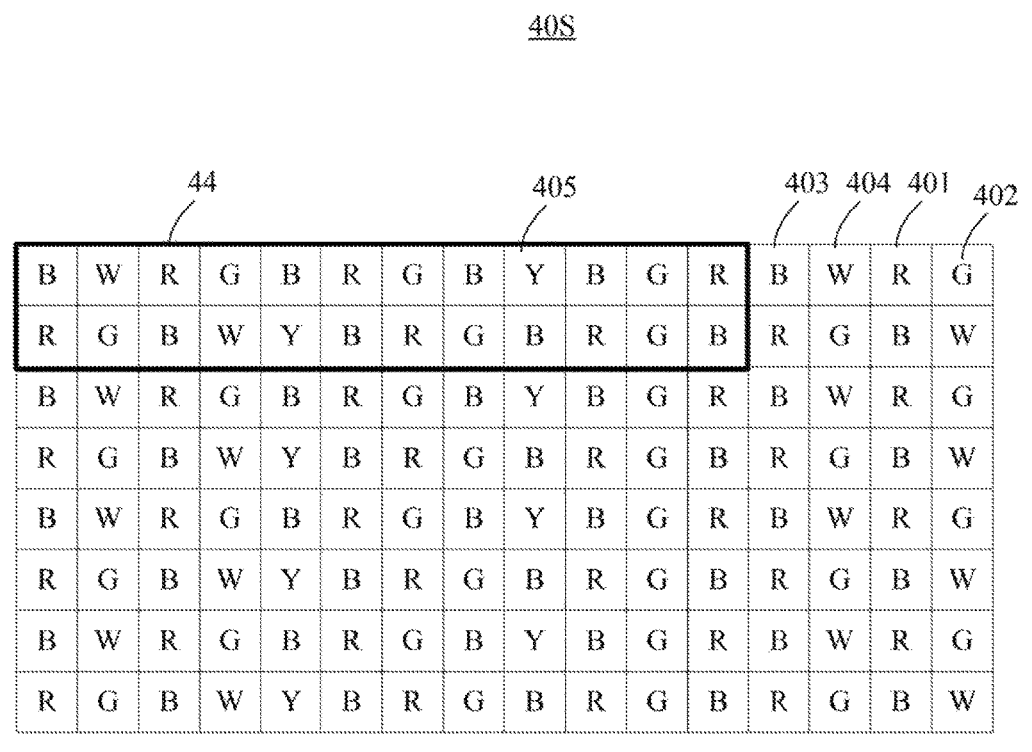

FIG. 23-25 illustrates several modified examples of image devices 40Q-40S following the arrangement rule of the fourth sub-pixels 404 and fifth sub-pixel 405 described above shown in FIG. 22 according to the sixth exemplary embodiment of the present disclosure. Each of the image devices 40Q-40S includes a plurality of pixels including a plurality of sub-pixels with different colors arranged in a matrix of rows and columns. A basic repeating pixel unit 44 is defined by the sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIG. 23-25, the basic repeating pixel unit 44 is a 2×12 matrix. Each row includes the white sub-pixels 404 and the yellow sub-pixels 405. In a same row, the white sub-pixels 404 and the yellow sub-pixels are separated disposed, and each of the yellow sub-pixels 405 is arranged between the two white sub-pixels 404. Each two adjacent columns containing the yellow sub-pixels 405 are arranged between two columns containing the white sub-pixels 404. In each of the columns containing the white sub-pixels 404, the white sub-pixels 404 are arranged in different rows, and are separated from each other by one sub-pixel different from the white sub-pixel 404 and the yellow sub-pixel 405. In each of the columns containing the yellow sub-pixels 405, the yellow sub-pixels 405 are arranged in different rows, and are separated from each other by one sub-pixel different from the white sub-pixel 404 and the yellow sub-pixel 405.

In the image device 40Q, the first sub-pixel 401 is a blue sub-pixel, the second sub-pixel 402 is a green sub-pixel, and the third sub-pixel 403 is a red sub-pixel. In the image device 40R, the first sub-pixel 401 is a red sub-pixel, the second sub-pixel 402 is a blue sub-pixel, and the third sub-pixel 403 is a green sub-pixel. In the image device 40S, the first is a red sub-pixel, the second sub-pixel 402 is a green sub-pixel, and the third sub-pixel 403 is a blue sub-pixel.

Figure 26:
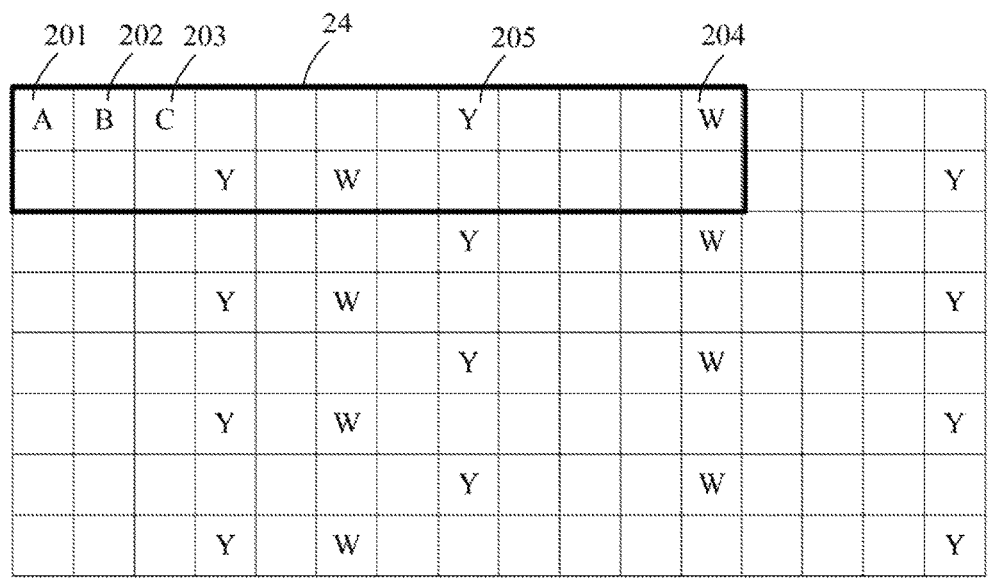
FIG. 26 illustrates an image device according to a seventh exemplary embodiment of the present disclosure.

FIG. 26 illustrates a seventh exemplary embodiment of the image device 20. The basic repeating pixel unit 24 is a 2×12 matrix. Each row includes the fourth sub-pixels 204 and the fifth sub-pixels 205. In a same row, the fourth sub-pixels 204 and the fifth sub-pixel 205 are separated disposed, and each of the fifth sub-pixels 205 is arranged between the two fourth sub-pixels 204. The column containing the fifth sub-pixels 205 are disposed between two columns containing the fourth sub-pixels 204. In each of the columns containing the fourth sub-pixels 204, the fourth sub-pixels 204 are arranged in different rows, and are separated from each other by one sub-pixel different from the fourth sub-pixel 204 and the fifth sub-pixel 205. In each of the columns containing the fifth sub-pixels 205, the fifth sub-pixels 205 are arranged in different rows, and are separated from each other by one sub-pixel different from the fourth sub-pixel 204 and the fifth sub-pixel 205. In at least one embodiment, the fourth sub-pixel 204 is the white sub-pixel, and the fifth sub-pixels 205 is a yellow sub-pixel. FIG. 26 shows an arrangement rule of the fourth sub-pixels 204 and the fifth sub-pixel 205 according to the seventh exemplary embodiment.

FIGS. 27-30 illustrate several modified examples of image devices 40T-40W following the arrangement rule of the fourth sub-pixels 404 and fifth sub-pixel 405 described above shown in FIG. 26 according to the seventh exemplary embodiment of the present disclosure. Each of the image devices 40T-40W includes a plurality of pixels including a plurality of sub-pixels with different colors arranged in a matrix of rows and columns. A basic repeating pixel unit 44 is defined by the sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIGS. 27-30, the basic repeating pixel unit 44 is a 2×12 matrix. Each row includes the white sub-pixels 204 and the yellow sub-pixels 205. In a same row, the white sub-pixels 204 and the yellow sub-pixels 205 are separated disposed, and each of the yellow sub-pixels 205 is arranged between the two white sub-pixels 204. The column containing the yellow sub-pixels 205 are disposed between two columns containing the white sub-pixels 204. In each of the columns containing the white sub-pixels 204, the white sub-pixels 204 are arranged in different rows, and are separated from each other by one sub-pixel different from the white sub-pixel 204 and the yellow sub-pixel 205. In each of the columns containing the yellow sub-pixels 205, the yellow sub-pixels 205 are arranged in different rows, and are separated from each other by one sub-pixel different from the white sub-pixel 204 and the yellow sub-pixel 205.

In the image devices 40T and 40U, the first sub-pixel 401 is a blue sub-pixel, the second sub-pixel 402 is a green sub-pixel, and the third sub-pixel 403 is a red sub-pixel. In the image device 40V, the first sub-pixel 401 is a red sub-pixel, the second sub-pixel 402 is a blue sub-pixel, and the third sub-pixel 403 is a green sub-pixel. In the image device 40W, the first sub-pixel 401 is a red sub-pixel, the second sub-pixel 402 is a green sub-pixel, and the third sub-pixel 403 is a blue sub-pixel.

Figure 31:
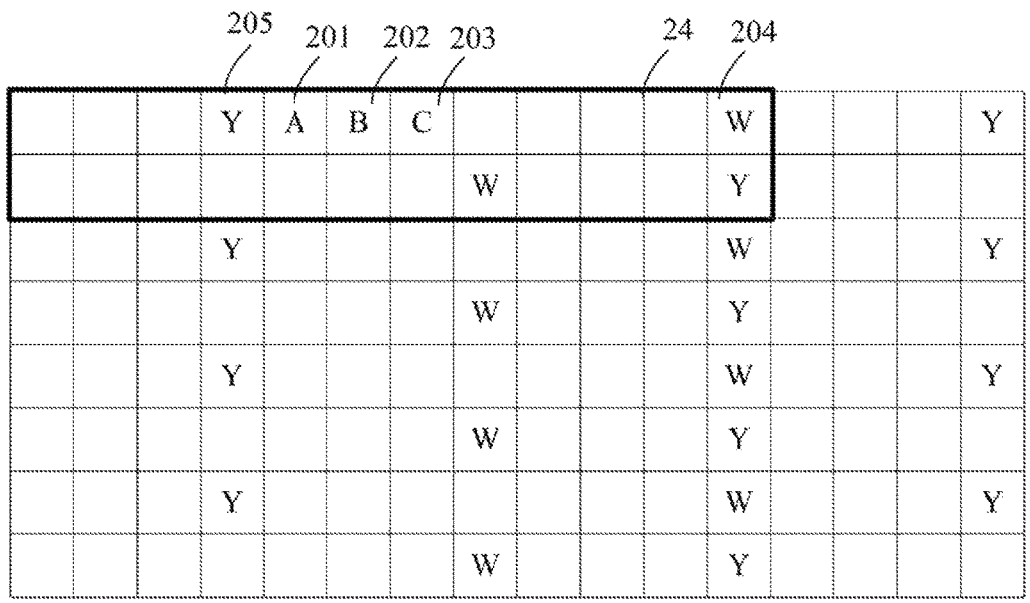
FIG. 31 illustrates an image device according to an eighth exemplary embodiment of the present disclosure.

FIG. 31 illustrates an eighth exemplary embodiment of the image device 20. The basic repeating pixel unit 24 is a 2×12 matrix. Each row includes the fourth sub-pixels 204 and the fifth sub-pixels 205. In a same row, the fourth sub-pixels 204 and the fifth sub-pixels 205 are separated disposed, and each the fifth sub-pixels 205 is arranged between the two fourth sub-pixels 204. The column containing the fourth sub-pixels 204 and the fifth sub-pixels 205 are disposed between a column containing the fourth sub-pixels 204 and a column containing the fifth sub-pixels 205. In each of the columns containing the fourth sub-pixels 204, the fourth sub-pixels 204 are arranged in different rows, and are separated from each other by one sub-pixel different from the fourth sub-pixel 204 and the fifth sub-pixel 205. In each of the columns containing the fifth sub-pixels 205, the fifth sub-pixels 205 are arranged in different rows, and are separated from each other by one sub-pixel different from the fourth sub-pixel 204 and the fifth sub-pixel 205. In each of the columns containing the fourth sub-pixels 204 and the fifth sub-pixels 205, the fourth sub-pixels 204 and the fifth sub-pixels 205 are staggered disposed. Namely, the fifth sub-pixel 205 is disposed between two adjacent fourth sub-pixels 204, and the fourth sub-pixel 204 is disposed between two adjacent fifth sub-pixels 205. In at least one embodiment, the fourth sub-pixel 204 is the white sub-pixel, and the fifth sub-pixels 205 is a yellow sub-pixel. FIG. 31 shows an arrangement rule of the fourth sub-pixel 204 and the fifth sub-pixel 205 according to the eighth exemplary embodiment.

FIG. 32 illustrates several modified examples of image devices 40X following the arrangement rule of the fourth sub-pixels 404 and fifth sub-pixels 405 described above shown in FIG. 31 according to the eighth exemplary embodiment of the present disclosure. Each of the image devices 40X includes a plurality of pixels including a plurality of sub-pixels with different colors arranged in a matrix of rows and columns. A basic repeating pixel unit 44 is defined by the sub-pixels with different colors arranged in a matrix of rows and columns. The basic repeating pixel 44 includes first sub-pixels 401, second sub-pixels 402, third sub-pixels 403, white sub-pixels 404, and yellow sub-pixels 405. A ratio of the first sub-pixels 401 to the second sub-pixels 402 to the third sub-pixels 403 to the white sub-pixels 404 to the yellow sub-pixels 405 is 3:3:4:1:1.

As shown in FIG. 32, the basic repeating pixel unit 44 is a 2×12 matrix. Each row includes the white sub-pixels 404 and the yellow sub-pixels 405. In a same row, the white sub-pixels 404 and the yellow sub-pixels 405 are separated disposed, and each the yellow sub-pixels 405 is arranged between the two white sub-pixels 404. The column containing the white sub-pixels 404 and the yellow sub-pixels 405 are disposed between a column containing the white sub-pixels 404 and a column containing the yellow sub-pixels 405. In each of the columns containing the white sub-pixels 404, the white sub-pixels 404 are arranged in different rows, and are separated from each other by one sub-pixel different from the white sub-pixel 404 and the yellow sub-pixel 405. In each of the columns containing the yellow sub-pixels 405, the yellow sub-pixels 405 are arranged in different rows, and are separated from each other by one sub-pixel different from the white sub-pixel 404 and the yellow sub-pixel 405. In each of the columns containing the white sub-pixels 404 and the yellow sub-pixels 405, the white sub-pixel 404 and the yellow sub-pixels 405 are staggered disposed. Namely, the yellow sub-pixel 405 is disposed between two adjacent white sub-pixels 404, and the white sub-pixel 404 is disposed between two adjacent yellow sub-pixels 405.

In the image device 40X, the first sub-pixel 401 is a green sub-pixel, the second sub-pixel 402 is a red sub-pixel, and the third sub-pixel 403 is a blue sub-pixel.

Further, a designated fourth balance status can be maintained by adjusting the blue information of the image device. In case of liquid-crystal display LCD, for example the backlight color can be adjusted, and/or the thickness, area, and/or pigment of the blue sub-pixels in the color filter can be adjusted, and/or the utilization of quantum dots can be adjusted so as to adjust the blue information and to maintain a designated fourth balance status of the image device. In case of organic light-emitting diode OLED plus color filter, OLED color can be adjusted to bluish, and/or the thickness, area, and/or pigment of the blue sub-pixels in the color filter can be adjusted, and/or the utilization of quantum dots can be adjusted so as to adjust the blue information and to maintain a designated fourth balance status of the image device.

The present disclosure also provides a method to determine the ratio of the number of RGBW pixels to the number of RGBY pixels in an image device according to the invention. The method of the present disclosure includes a step for determining the ratio by a function of a fifth sub-pixel information, a red sub-pixel information, a green sub-pixel information, a blue sub-pixel information and a fourth sub-pixel information of the image device. The sub-pixel information includes the chrominance data and luminance data of the said sub-pixel. In an exemplary embodiment, the fifth sub-pixel information includes the chrominance data and luminance data of the fifth sub-pixel, the red sub-pixel information includes the chrominance data and luminance data of the red sub-pixel, the green sub-pixel information includes the chrominance data and luminance data of the green sub-pixel, and the fourth sub-pixel information includes the chrominance data and luminance data of the fourth sub-pixel.

By the addition of RGBY pixels, the problem of dark fifth in the conventional RGBW display can be solved and chrominance quality can be improved. The present invention thus can solve the dark fifth problem of conventional RGBW display. The bluish problem can also be solved by the addition of RGBY pixels.

The foregoing outlines features of several exemplary embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the exemplary embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image device comprising:
a plurality of first sub-pixels;
a plurality of second sub-pixels;
a plurality of third sub-pixels;
a plurality of fourth sub-pixels; and
a plurality of fifth sub-pixels;
wherein the image device comprises a plurality of basic repeating units; each of the plurality of basic repeating units comprises the first sub-pixels, the second sub-pixels, the third sub-pixels, the fourth sub-pixels, and the fifth sub-pixel; a ratio of the first sub-pixels to the second sub-pixels to the third sub-pixels to the fourth sub-pixels and to the fifth sub-pixel in the basic repeating unit is 3:3:4:1:1; and
a pixel group is defined by:
one of the fourth sub-pixels and one of the fifth sub-pixels in a same row, the fifth sub-pixel is adjacent to the fourth sub-pixel in the same pixel group, each of the pixel groups is separated from each other.

2. The image device of claim 1, wherein every odd row includes the fourth sub-pixels and the fifth sub-pixels, and every even row excludes the fourth sub-pixels and the fifth sub-pixel.

3. The image device of claim 1, wherein the basic repeating pixel unit is a 2×6 matrix; each two adjacent columns containing the fourth sub-pixel and the fifth sub-pixel are separated from each other by four columns with sub-pixels different from the fourth sub-pixel and the fifth sub-pixel.

4. The image device of claim 1, wherein the basic repeating pixel unit is a 4×6 matrix; each of two adjacent columns containing the fourth sub-pixel and the fifth sub-pixel are separated from each other by one column with sub-pixels different from the fourth sub-pixel and the fifth sub-pixel.

5. The image device of claim 1, wherein each of the rows contains the fourth sub-pixels and the fifth sub-pixels.

6. The image device of claim 5, wherein a pixel group is defined by one fourth sub-pixel and one fifth sub-pixel in a same row, the pixel groups in the same row are separated from each other; in any two adjacent rows, the pixel groups are staggered disposed.

7. The image device of claim 5, wherein each of two adjacent columns containing the fourth sub-pixels and the fifth sub-pixels are separated from each other by four columns.

8. The image device of claim 5, wherein the basic repeating pixel unit is a 2×12 matrix.

9. The image device of claim 5, wherein the fourth sub-pixels and the fifth sub-pixels in a same row are separated disposed, and each of the fifth sub-pixels is arranged between the two fourth sub-pixels.

10. The image device of claim 9, wherein the columns containing the fourth sub-pixels and the columns containing the fifth sub-pixels are separated disposed, and two adjacent columns containing the fifth sub-pixels are arranged between two columns containing the fourth sub-pixels.

11. The image device of claim 9, wherein the columns containing the fourth sub-pixels and the columns containing the fifth sub-pixels are separated disposed, and the column containing the fifth sub-pixels is arranged between two columns containing the fourth sub-pixels.

12. The image device of claim 5, wherein the fifth sub-pixel is arranged between the two fourth sub-pixels; each the fourth sub-pixels is adjacent to the fifth sub-pixel.

13. The image device of claim 12, wherein two adjacent columns containing the fourth sub-pixels and the fifth sub-pixels are disposed between a column containing the fourth sub-pixels and a column containing the fifth sub-pixels.

14. The image device of claim 1, wherein every odd row includes the fourth sub-pixels and excludes the fifth sub-pixels, and every even row includes the fifth sub-pixels and excludes the fourth sub-pixels.

15. The image device of claim 14, wherein the fourth sub-pixels in the same row are separated from each other by a predetermined number of sub-pixels different from the fourth sub-pixel and the fifth sub-pixel.

16. The image device of claim 14, wherein the fifth sub-pixels in the same row are separated from each other by a predetermined number of sub-pixels different from the fourth sub-pixel and the fifth sub-pixel.

17. The image device of claim 14, wherein each of two adjacent columns containing the fourth sub-pixels and the fifth sub-pixel are separated from each other by four columns.

18. The image device of claim 1, wherein each fourth sub-pixel is a white sub-pixel, and each fifth sub-pixel is a yellow sub-pixel.

19. The image device of claim 1, wherein the plurality of the first sub-pixels, the plurality of the second sub-pixels, and the plurality of the third sub-pixels are red sub-pixels, blue sub-pixels, and green sub-pixels respectively.

20. An image device comprising:
a plurality of first sub-pixels;
a plurality of second sub-pixels;
a plurality of third sub-pixels;
a plurality of fourth sub-pixels; and
a plurality of fifth sub-pixels;
wherein the image device comprises a plurality of basic repeating units; each of the plurality of basic repeating units comprises the first sub-pixels, the second sub-pixels, the third sub-pixels, the fourth sub-pixels, and the fifth sub-pixel; a ratio of the first sub-pixels to the second sub-pixels to the third sub-pixels to the fourth sub-pixels and to the fifth sub-pixel in the basic repeating unit is 3:3:4:1; a pixel group is defined by one of the fourth sub-pixels and one of the fifth sub-pixels in a same row; the fourth sub-pixel and the fifth sub-pixel in the same pixel group are separated disposed by one sub-pixel different from the fourth sub-pixel and the fifth sub-pixel;
wherein each of the plurality of basic repeating pixel units is a 2×6 matrix; the columns containing the fourth sub-pixel and the column containing the fifth sub-pixel are staggered disposed, and are separated from each other.

* * * * *